United States Patent
Sato et al.

(10) Patent No.: US 8,093,647 B2
(45) Date of Patent: Jan. 10, 2012

(54) NONVOLATILE SEMICONDUCTOR MEMORY HAVING TRANSISTOR WITH A DIFFUSION BLOCKING LAYER BETWEEN THE LOWER GATE AND FULLY SILICIDED UPPER GATE

(75) Inventors: Atsuhiro Sato, Yokohama (JP); Mutsumi Okajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/959,919

(22) Filed: Dec. 19, 2007

(65) Prior Publication Data

US 2008/0179654 A1    Jul. 31, 2008

(30) Foreign Application Priority Data

Dec. 20, 2006   (JP) ................... 2006-343169

(51) Int. Cl.
  *H01L 29/76*   (2006.01)
  *H01L 29/788*  (2006.01)
  *H01L 29/78*   (2006.01)
  *H01L 23/52*   (2006.01)
  *H01L 29/40*   (2006.01)
  *H01L 29/49*   (2006.01)

(52) U.S. Cl. ........ 257/316; 257/314; 257/315; 257/412; 257/413; 257/755; 257/E29.161

(58) Field of Classification Search ................ 257/321, 257/211, 319, 320, 366, 314, 316, 315, 412, 257/E29.16, E29.161, 326, 325, E29.156, 257/614, 413, 755

See application file for complete search history.

(56) References Cited

U.S. PATENT DOCUMENTS

| | | | |
|---|---|---|---|
| 6,096,640 A * | 8/2000 | Hu | 438/652 |
| 6,236,093 B1 * | 5/2001 | Hiura | 257/413 |
| 6,420,754 B2 * | 7/2002 | Takahashi et al. | 257/326 |
| 6,835,978 B2 | 12/2004 | Matsui et al. | |
| 7,067,872 B2 | 6/2006 | Ichige et al. | |
| 2007/0176224 A1 * | 8/2007 | Yaegashi | 257/315 |
| 2007/0262368 A1 * | 11/2007 | Chang et al. | 257/314 |
| 2009/0278184 A1 | 11/2009 | Yaegashi | |
| 2009/0278191 A1 | 11/2009 | Yaegashi | |

FOREIGN PATENT DOCUMENTS

JP    2003-60092    2/2003

OTHER PUBLICATIONS

U.S. Appl. No. 12/618,119, filed Nov. 13, 2009, Izumida, et al.
U.S. Appl. No. 12/406,481, filed Mar. 18, 2009, Toba.
U.S. Appl. No. 12/407,131, filed Mar. 19, 2009, Sakuma.
U.S. Appl. No. 12/497,955, filed Jul. 6, 2009, Nagano.

* cited by examiner

*Primary Examiner* — Phat Cao
*Assistant Examiner* — Diana C Vieira
(74) *Attorney, Agent, or Firm* — Oblon, Spivak, McClelland, Maier & Neustadt, L.L.P.

(57) ABSTRACT

A memory cell has a floating gate electrode, a first inter-gate insulating film arranged on the floating gate electrode, and a control gate electrode arranged on the first inter-gate insulating film. An FET has a lower gate electrode, a second inter-gate insulating film having an opening and arranged on the lower gate electrode, a block film having a function to block diffusion of metal atoms and formed on at least the opening, and an upper gate electrode connected electrically to the lower gate electrode via the block film and arranged on the second inter-gate insulating film. The control gate electrode and the upper gate electrode have a Full-silicide structure.

8 Claims, 18 Drawing Sheets

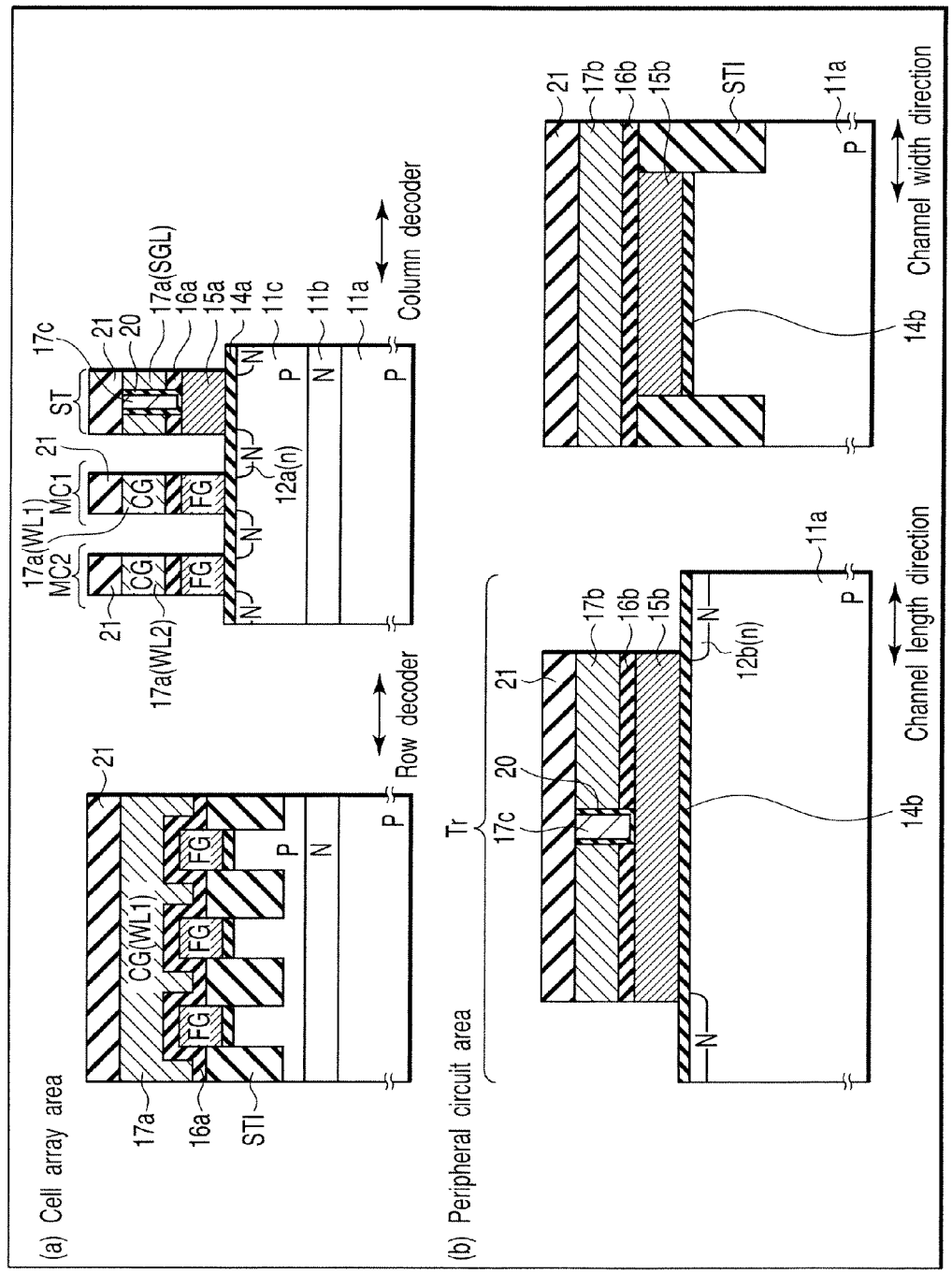
F I G. 11

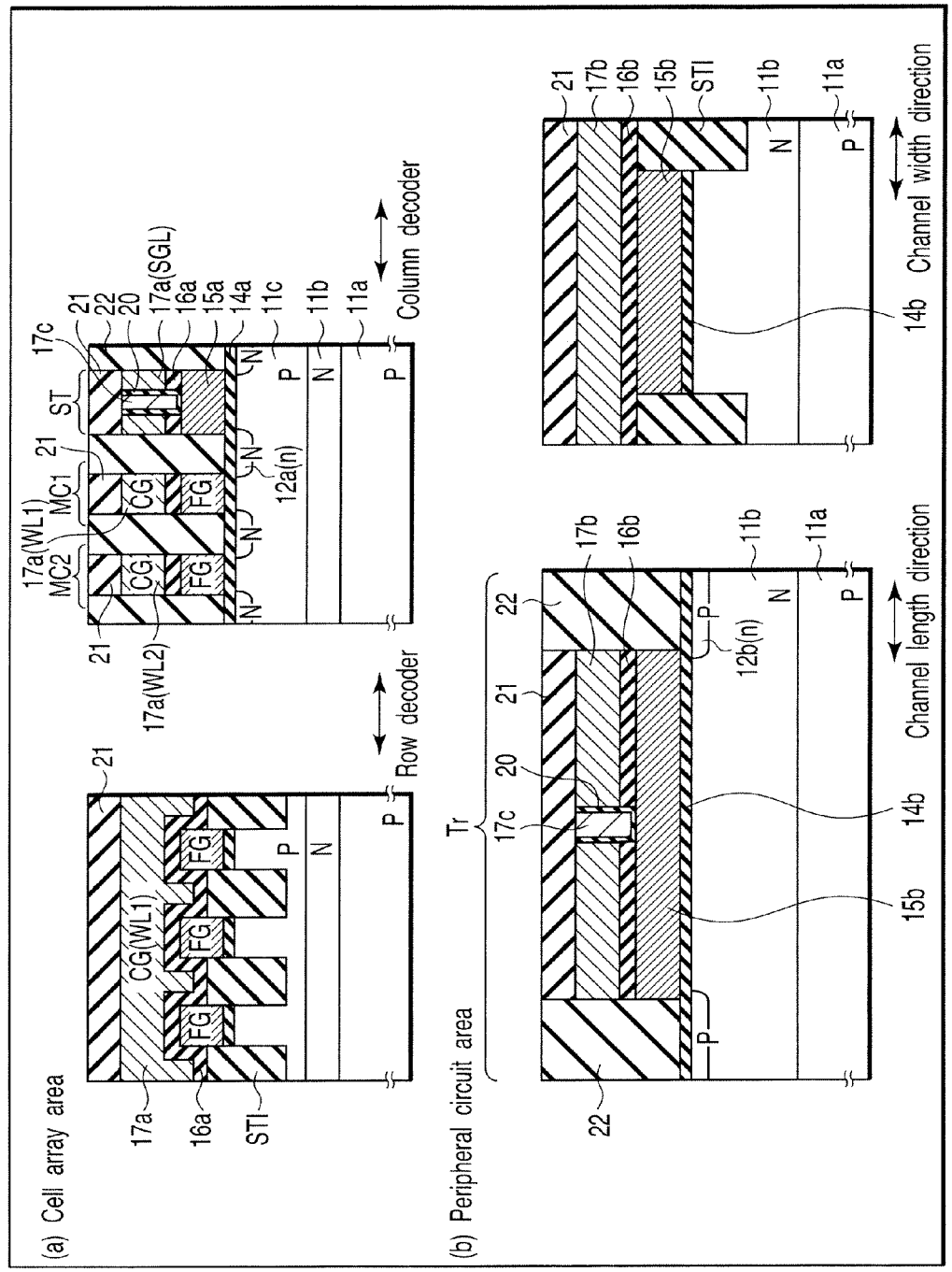
F I G. 12

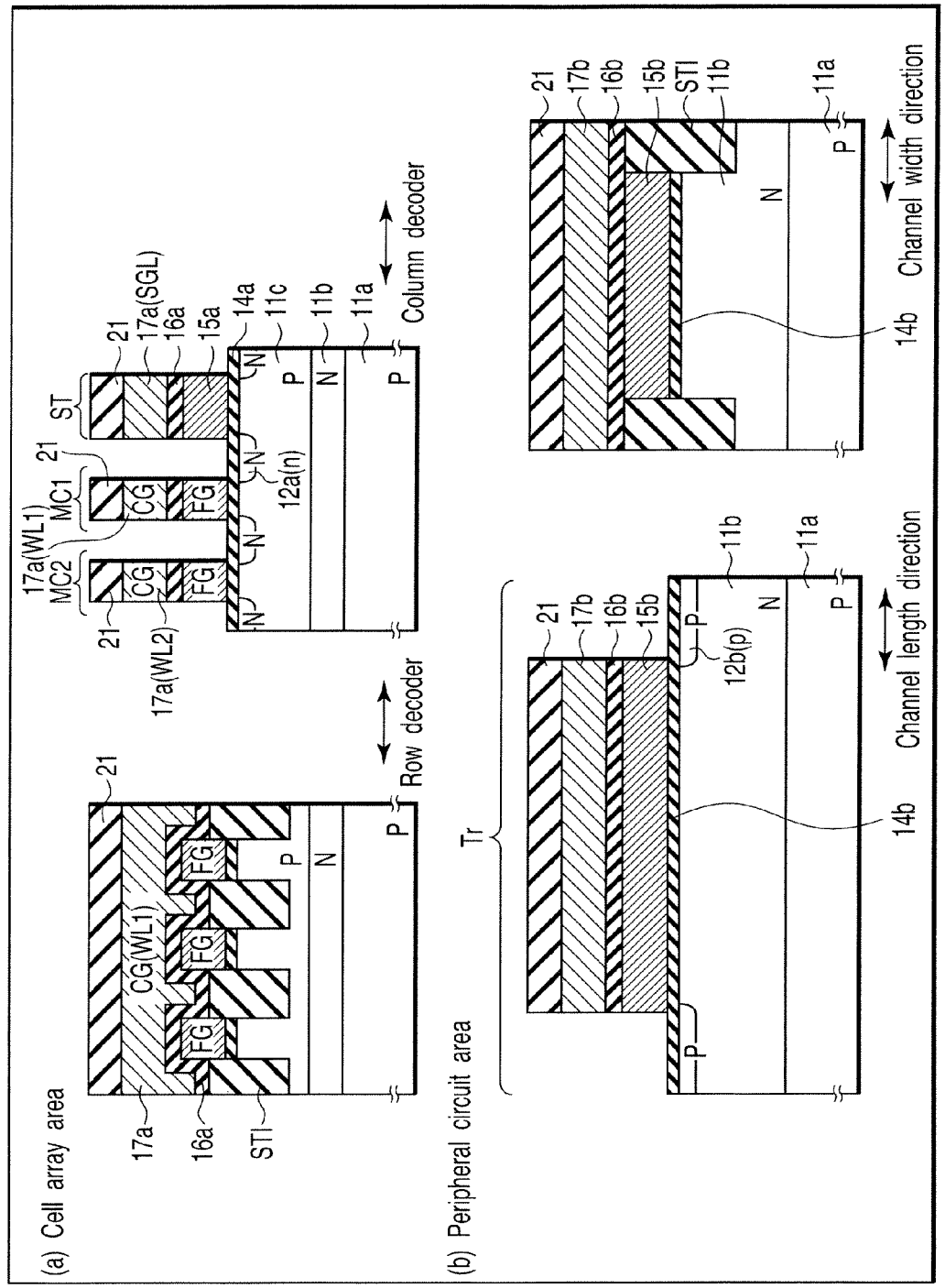
F I G. 14

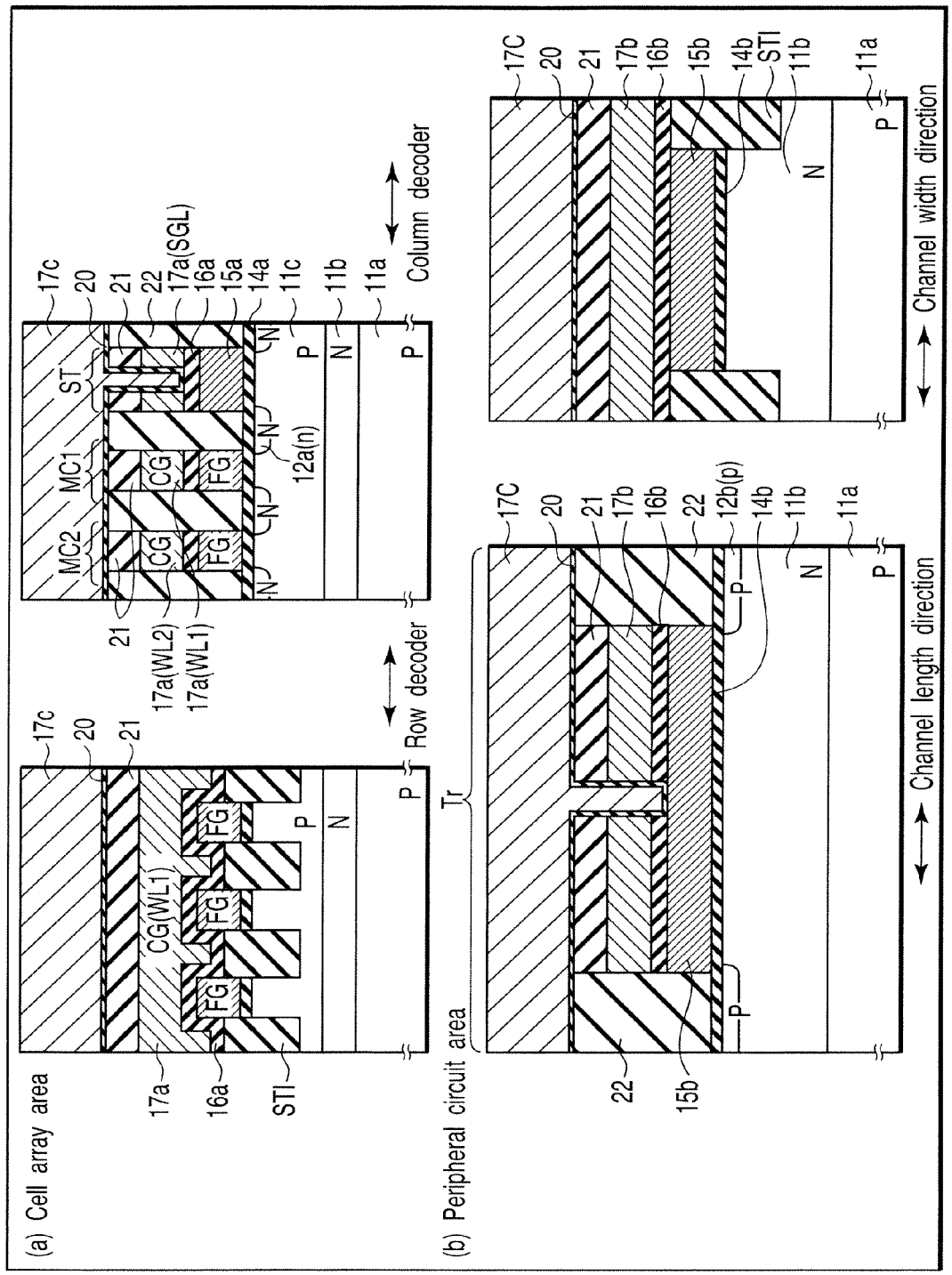
F I G. 18

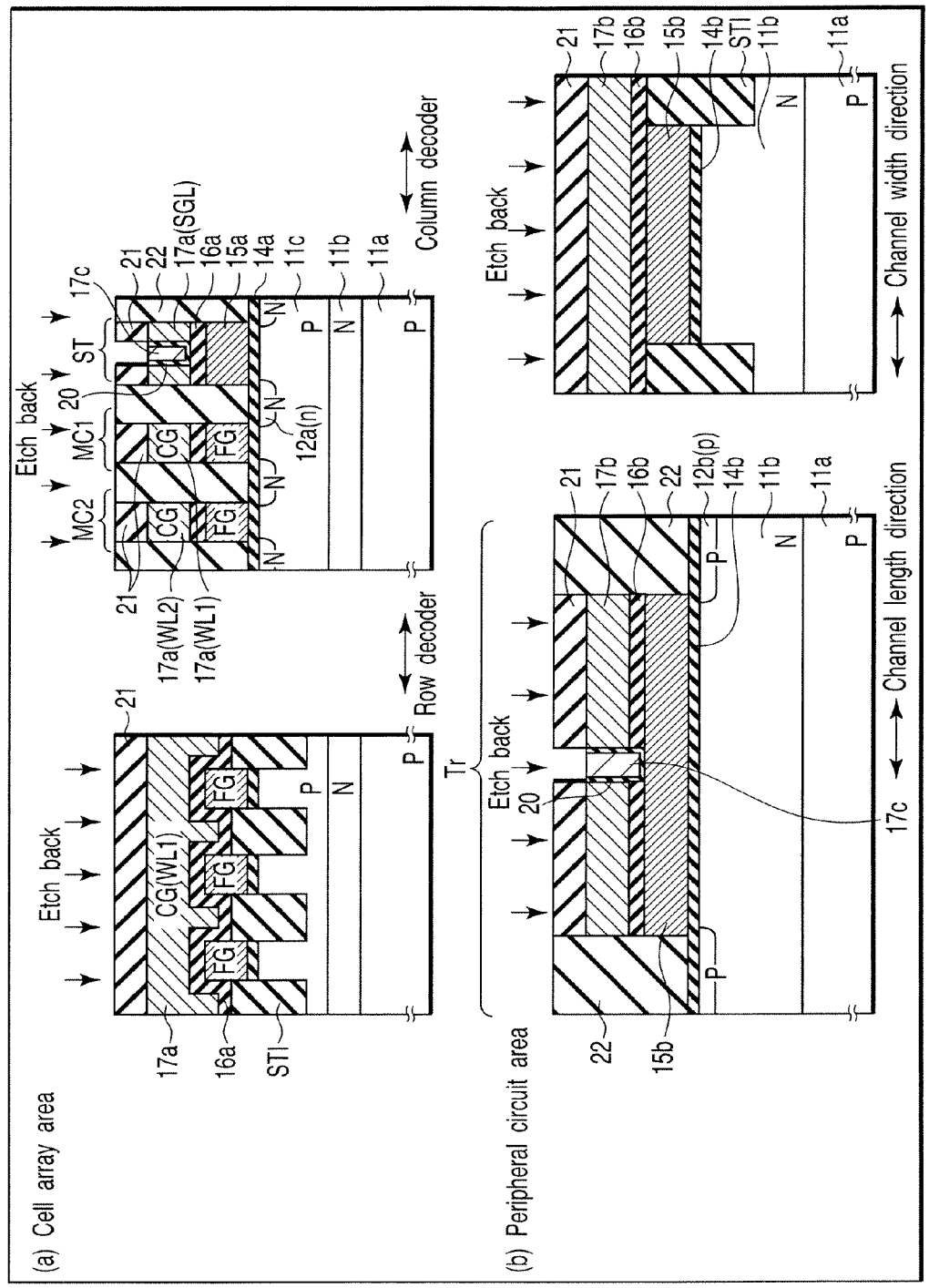
F I G. 19

NONVOLATILE SEMICONDUCTOR MEMORY HAVING TRANSISTOR WITH A DIFFUSION BLOCKING LAYER BETWEEN THE LOWER GATE AND FULLY SILICIDED UPPER GATE

CROSS-REFERENCE TO RELATED APPLICATIONS

This application is based upon and claims the benefit of priority from prior Japanese Patent Application No. 2006-343169, filed Dec. 20, 2006, the entire contents of which are incorporated herein by reference.

BACKGROUND OF THE INVENTION

1. Field of the Invention

The present invention relates to a nonvolatile semiconductor memory with a FUSI (Full Silicide) structure in which an entirety of a control gate electrode is silicided.

2. Description of the Related Art

In a nonvolatile semiconductor memory having a memory cell with a stack gate structure, for instance, a NAND type flash memory, when the memory cell is shrunk and its gate length becomes in 50 nm or less, floating gate electrodes of the two memory cells adjacent to each other interfere, so that various problems occur (for instance, refer to Jpn. Pat. Appln. KOKAI Publication No. 2003-60092).

For instance, in the case of the cell structure in which a control gate electrode (word line) covers a side surface of the floating gate electrode, when part of the control gate electrode, that is, part between the floating gate electrodes is depleted due to miniaturization of the memory cell, the part does not function as the gate electrode, so that coupling ratio deteriorates.

In addition, since parasitic capacitance generated between the two control gate electrodes (word line) adjacent to each other becomes large, signal speed slows, resulting in cause of increase in write/read time.

In order to solve such problem, there has been proposed a FUSI (Full Silicide) structure in which an entirety of the control gate electrode is silicided.

According to the memory cell with the FUSI (Full Silicide) structure, part of the control gate electrode is not depleted; and in addition, since the silicide itself is in low resistance, signal delay is alleviated.

However, there is a problem in the FUSI (Full Silicide) structure. In case of employing this structure, the problem is that fluctuation of property of FET (Field Effect Transistor) formed simultaneously with a memory cell becomes large.

Specifically, the FET (a selection transistor in a cell array, transistors constituting a peripheral circuit) formed simultaneously with the memory cell, like the memory cell, has a stack gate structure. However, two gate electrodes are electrically connected to each other via an inter-gate insulating film, that is, via an opening provided at IPD (Inter-Polysilicon Dielectric).

In this case, when siliciding an entirety of an upper gate electrode of the FET at the same time as the control gate electrode is silicided, metal atoms are diffused in a lower gate electrode via the opening provided on the inter-gate insulating film; and then part of the lower gate electrode is also silicided.

Then, in the case where silicide formation of the lower gate electrode advances to a neighboring area to a gate insulating film, the structure results in a state that part in which the silicide comes into contact with the gate insulating film, and part in which conductive polysilicon neighbors the gate insulating film are mixed.

Since a flatband voltage to a silicon substrate of the silicide is different from that of the conductive polysilicon, there occurs a problem that threshold of FET fluctuates depending on state of progress of the silicide formation of the lower gate electrode.

BRIEF SUMMARY OF THE INVENTION

A nonvolatile semiconductor memory according to an aspect of the present invention comprises a memory cell and an FET, and the memory cell has a floating gate electrode, a first inter-gate insulating film arranged on the floating gate electrode, and a control gate electrode arranged on the first inter-gate insulating film. The FET has a lower gate electrode, a second inter-gate insulating film having an opening and arranged on the lower gate electrode, a block film having a function to block diffusion of metal atoms and formed on at least the opening, and an upper gate electrode connected electrically to the lower gate electrode via the block film and arranged on the second inter-gate insulating film. The control gate electrode and the upper gate electrode have a FUSI (Full-silicide) structure in which an entirety of them is silicided, while the lower gate electrode is not silicided.

A method for manufacturing a nonvolatile semiconductor memory according to an aspect of the present invention comprises the steps of, forming a first conductive film, forming an insulating film on the first conductive film, forming a second conductive film on the insulating film, forming an opening reaching the first conductive film on the second conductive film and the insulating film, forming a block film having a function to block diffusion of metal atoms on at least the opening, forming a third conductive film on the block film, etching back the third conductive film and the second conductive film, performing patterning of the second conductive film, the insulating film and the first conductive film, forming a floating gate electrode comprised of the first conductive film, a first inter-gate insulating film comprised of the insulating film on the floating gate electrode and a control gate electrode comprised of the second conductive film on the first inter-gate insulating film, and simultaneously forming a lower gate electrode comprised of the first conductive film, a second inter-gate insulating film comprised of the insulating film on the lower gate electrode including the opening and an upper gate electrode comprised of the second and third conductive films on the second inter-gate insulating film, and siliciding an entirety of the control gate electrode and an entirety of the upper gate electrode.

A method for manufacturing a nonvolatile semiconductor memory according to an aspect of the present invention comprises the steps of, forming a first conductive film, forming an insulating film on the first conductive film, forming a second conductive film on the insulating film, performing patterning of the second conductive film, the insulating film and the first conductive film, forming a floating gate electrode comprised of the first conductive film, a first inter-gate insulating film comprised of the insulating film on the floating gate electrode and a control gate electrode comprised of the second conductive film on the first inter-gate insulating film, and simultaneously forming a lower gate electrode comprised of the first conductive film, a second inter-gate insulating film comprised of the insulating film on the lower gate electrode and an upper gate electrode comprised of the second conductive film on the second inter-gate insulating film, forming an opening reaching the lower gate electrode on the upper gate electrode and the second inter-gate insulating film, forming a block film having a function to block diffusion of metal atoms on at least the opening, forming a third conductive film on the block film, etching back the third conductive film, and siliciding an entirety of the control gate electrode, an entirety of the upper gate electrode and an entirety of the third conductive film.

BRIEF DESCRIPTION OF THE SEVERAL VIEWS OF THE DRAWING

FIG. 11 is a cross sectional view showing the first example of the manufacturing method;

FIG. 12 is a cross sectional view showing the first example of the manufacturing method;

FIG. 14 is a cross sectional view showing a second example of the manufacturing method;

FIG. 18 is a cross sectional view showing the second example of the manufacturing method;

FIG. 19 is a cross sectional view showing the second example of the manufacturing method.

DETAILED DESCRIPTION OF THE INVENTION

A nonvolatile semiconductor memory of an aspect of the present invention will be described below in detail with reference to the accompanying drawings.

1. Outline

In examples of the present invention, FUSI (Full Silicide) technology siliciding an entirety of the control gate electrode of the memory cell with a stack gate structure is taken as a premise, and there is a characteristic in the structure of FET, such as the structure of a selection transistor in a cell array, or the structure of the transistors constituting a peripheral circuit (these transistors are generally called peripheral transistors).

Specifically, the peripheral transistor has a lower gate electrode, an inter-gate insulating film arranged on the lower gate electrode and having an opening, a block insulating film formed on at least the opening and having a function to block diffusion of metal atoms, and an upper gate electrode arranged on the inter-gate insulating film and connected electrically to the lower gate electrode via the block film.

Then, an entirety of the upper gate electrode is silicided, while the lower gate electrode is not silicided.

Such structure is realized in such a manner that the block film is arranged at the opening of the inter-gate insulating film. The block film blocks diffusion of the metal atoms. Thus, when fully siliciding the control gate electrode and the upper gate electrode, the metal atoms are not diffused in the lower gate electrode, and the siliciding of the lower gate electrode can be prevented.

The block film can secure conductivity between the lower gate electrode and the upper gate electrode.

As materials for such films and further having the function to block diffusion of the metal atoms, firstly there are conductors such as Ti and TiSi.

In addition, secondly, as materials being one of oxide, nitride, and oxynitride, and having no insulating function, for instance, $SiO_2$, $Si_xN_y$, SiON or the like may also be used as the block film.

Here, "having no insulating function" is the condition in which the lower gate electrode is electrically connected to the upper gate electrode by controlling film thickness, film quality or the like. For instance, in the case of $Si_xN_y$, it is possible to reject the insulating function by employing a structure in which $Si_xN_y$ has no structure of three-coordinate with trap conductivity, and in the case of $SiO_2$, it is possible to reject the insulating function by employing a structure in which a thickness of $SiO_2$ is around 2 nm.

2. Embodiment

There will be described an embodiment below.

Figure 1:
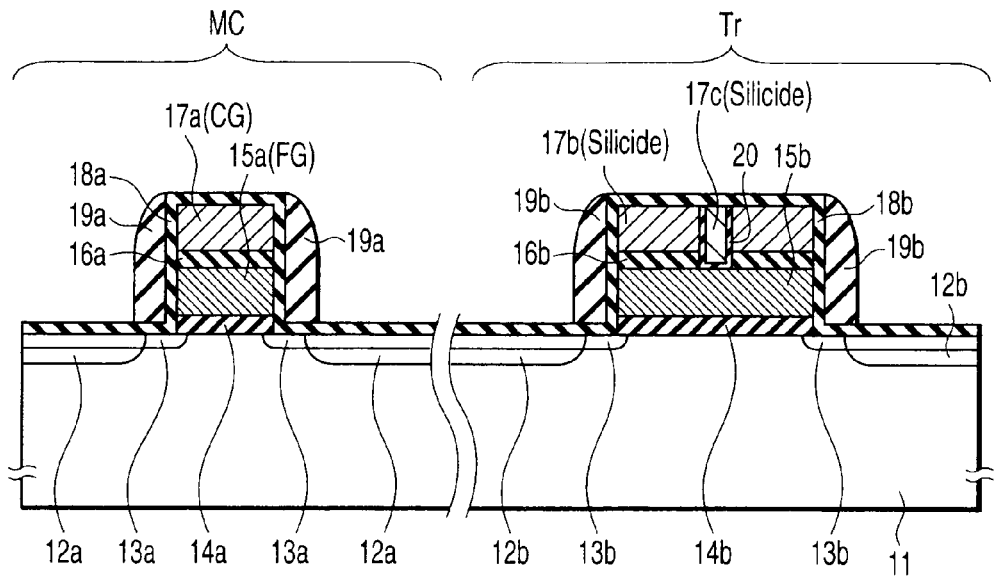
FIG. 1 is a cross sectional view of a device structure according to an example of the present invention.

FIG. 1 shows a device structure according to an example of the present invention.

On a silicon substrate 11, a memory cell MC with a stack gate structure and a peripheral transistor (FET) Tr are formed.

The memory cell MC has a source/drain diffusion layer 12a and an extension diffusion layer 13a in the silicon substrate 11. A floating gate electrode (FG) 15a is formed on a channel region between the source/drain diffusion layers 12a via a gate insulating film 14a. The floating gate electrode 15a is comprised of conductive polysilicon including impurities.

On the floating gate electrode 15a, a control gate electrode (CG) 17a is formed via an inter-gate insulating film 16a. The inter-gate insulating film 16a is comprised of, for instance, an insulating material of ONO (oxide/nitride/oxide) structure, high dielectric constant (High-k) material, or the like. In the example of the present invention, there is no limitation with respect to the structure of the inter-gate insulating film 16a.

The control gate electrode 17a has a FUSI (Full-Silicide) structure in which an entirety of the electrode is silicided. The control gate electrode 17a is comprised of, for instance, WSi, TaSi, NiSi CoSi or the like.

Here, the inter-gate insulating film is an insulator between two gate electrodes with the stack gate structure.

The floating gate electrode 15a and the control gate electrode 17a are covered by an insulating film 18a. Generally, the insulating film 18a is silicon oxide formed on a surface of the silicon substrate 11, a surface of the floating gate electrode 15a and a surface of the control gate electrode 17a by thermal oxidation.

An insulating film 19a called side wall is formed at a side wall part of the floating gate electrode 15a and the control gate electrode 17a. The insulating film 19a is comprised of, for instance, silicon nitride.

The peripheral transistor (FET) Tr has a source/drain diffusion layer 12b and an extension diffusion layer 13b in the silicon substrate 11. On a channel region between the source/ drain diffusion layers 12b, a lower gate electrode 15b is formed via a gate insulating film 14b.

The lower gate electrode 15b is comprised of the same material as that of the floating gate electrode 15a, that is, conductive polysilicon including impurities.

On the lower gate electrode 15b, an upper gate electrode 17b is formed via an inter-gate insulating film 16b. The inter-gate insulating film 16b is comprised of the same material as that of the inter-gate insulating film 16a, and the upper gate electrode 17b is comprised of the same material as that of the control gate electrode 17a.

However, provided on the inter-gate insulating film 16b and the upper gate electrode 17b is the opening, in which a block film 20 to block diffusion of the metal atoms and a conductive film 17c are formed. The conductive film 17c is comprised of the same material as that of the upper gate electrode 17b.

Like the control gate electrode 17a, the upper gate electrode 17b and the conductive film 17c have the FUSI (Full Silicide) structure in which an entirety thereof is silicided. The upper gate electrode 17b and the conductive film 17c are comprised of, for instance, WSi, TaSi, NiSi, CoSi or the like.

The lower gate electrode 15b and the upper gate electrode 17b are covered by an insulating film 18b. Like the insulating film 18a, the insulating film 18b is silicon oxide formed on a surface of the silicon substrate 11, a surface of the lower gate electrode 15b and a surface of the upper gate electrode 17b by thermal oxidation.

On a side wall part of the lower gate electrode 15b and the upper gate electrode 17b, an insulating film 19b called side wall is formed. The insulating film 19b is comprised of, for instance, silicon nitride.

According to such device structure, since the block film 20 blocks diffusion of the metal atoms, when fully siliciding the control gate electrode 17a and the upper gate electrode 17b, the metal atoms are not diffused in the lower gate electrode 15b via the opening of the inter-gate insulating film 16b, and it is possible to prevent the lower gate electrode 15b from being silicided.

Figure 2:
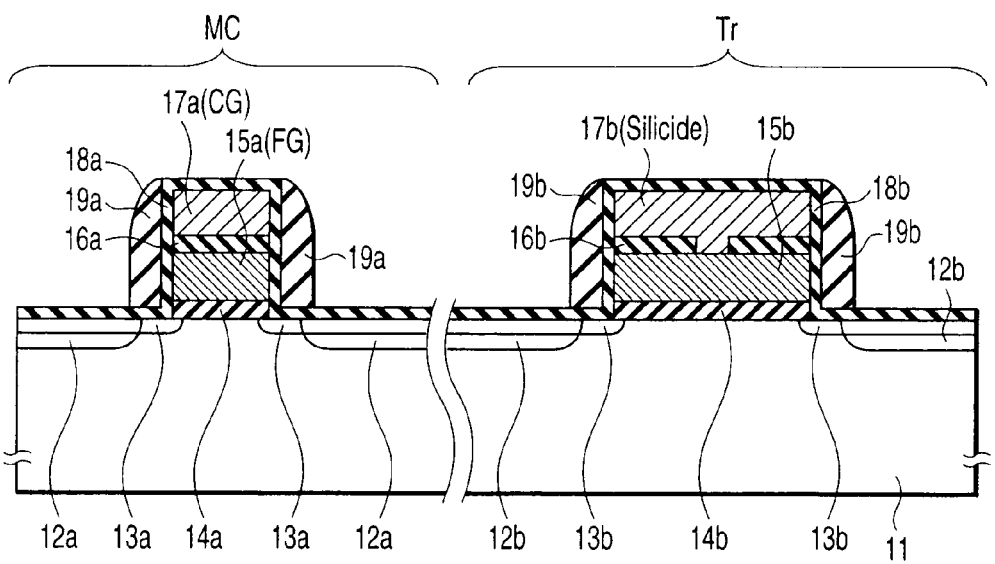
FIG. 2 is a cross sectional view of a device structure as a comparative example.

FIG. 2 shows a device structure as a comparative example.

This structure is different from the structure of FIG. 1 in that the block film does not exist on the opening of the inter-gate insulating film 16b.

The peripheral transistor (FET) Tr mixed and mounted on the memory cell MC of the stack gate structure has, usually, a device structure as shown in FIG. 2. In this case, as an idea, it is also possible to make only the upper gate electrode 17b fully silicided, and to make the lower gate electrode 15b non-silicided.

Figure 3:
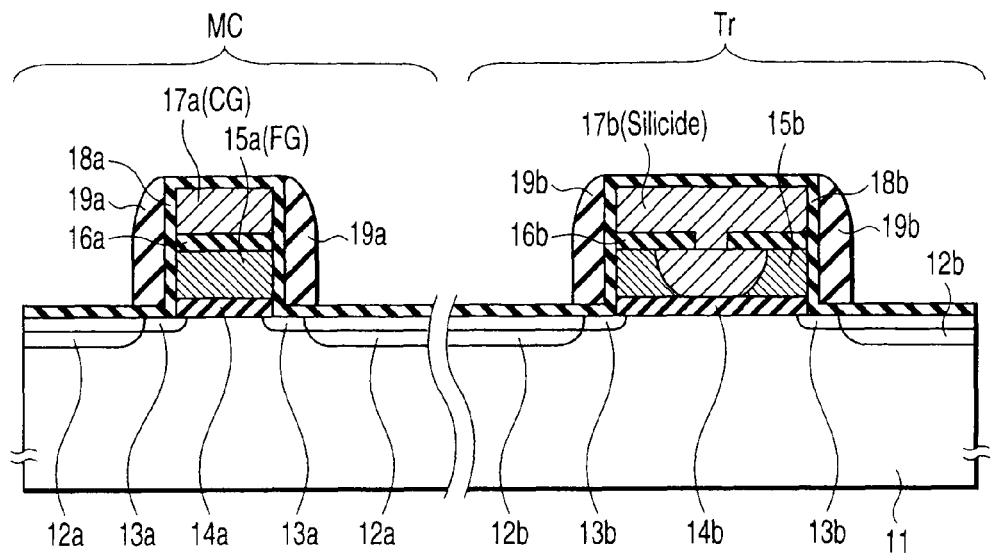
FIG. 3 is a cross sectional view of a device structure as a comparative example.

However, when forming a sample actually with this structure, as shown in FIG. 3, the silicide formation advances to the lower gate electrode 15b via the opening of the inter-gate insulating film 16b.

Therefore, as shown in FIG. 1, to cover the opening of the inter-gate insulating film 16b with the block film 20 is a very effective technique when executing full siliciding without fluctuation of property of the FET other than the memory cell.

3. Application Example

The example of the present invention may be generally applied to the nonvolatile semiconductor memory having the memory cell of the stack gate structure.

Here, the nonvolatile semiconductor memory includes general memories such as NAND type flash memory and NOR type flash memory, nonvolatile semiconductor memories mixed and mounted on a logic LSI, for instance, a 2-Tr type flash memory, a 3-Tr type flash memory, or the like.

There will be described the case in which the example of the present invention is applied to the NAND type flash memory which is a representative example of the nonvolatile memory.

(1) Overall View

Figure 4:
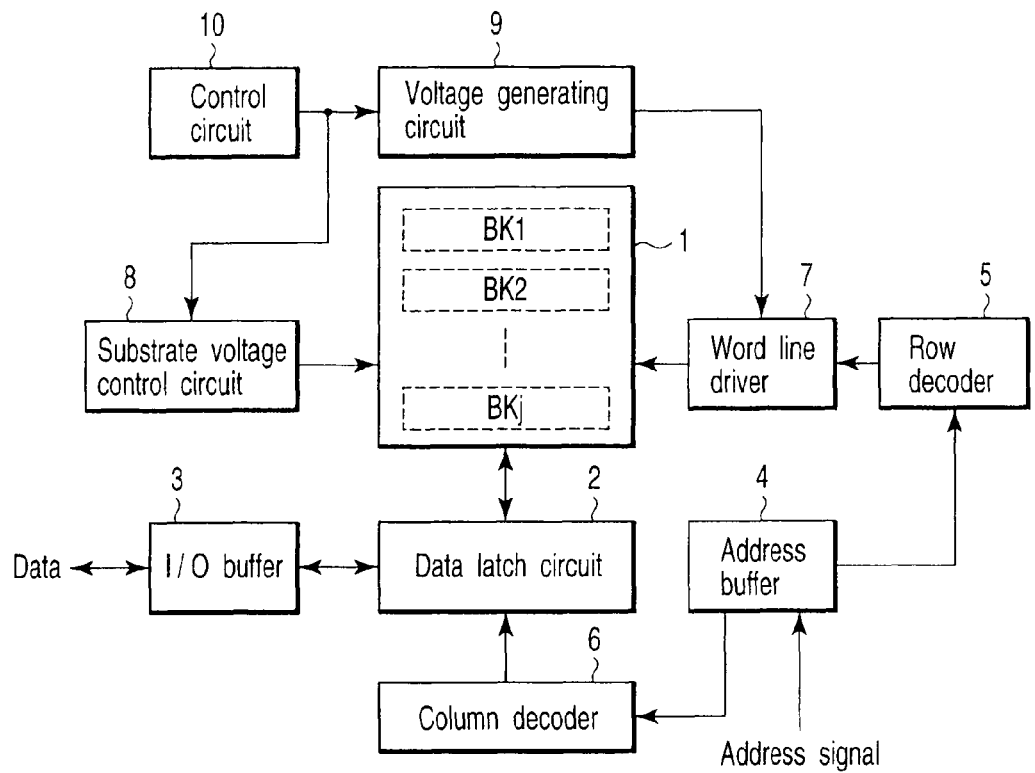
FIG. 4 is a view showing a NAND type flash memory.

FIG. 4 shows an overall view of the NAND type flash memory.

A memory cell array 1 is comprised of a plurality of blocks BK1, BK2, . . . BKj. Each of the plurality of blocks BK1, BK2, . . . BKj has a plurality of cell units, and each of the plurality of cell units is comprised of a NAND string comprised of a plurality of memory cells connected in series, and two select gate transistors connected to both ends of the NAND string one by one.

A data latch circuit 2 has a function to latch the data temporarily at the time of read/write, and is comprised of, for instance, a flip-flop circuit. An I/O (input/output) buffer 3 functions as an interface circuit of the data, and an address buffer 4 functions as an interface circuit of an address signal.

A row decoder 5 and a column decoder 6 select the memory cell in the memory cell array 1 based on the address signal. A word line driver 7 drives a selected word line in the selected block.

A substrate voltage control circuit 8 controls a voltage of the semiconductor substrate. Specifically, a double well region comprised of an n-type well region and a p-type well region is formed in a p-type semiconductor substrate. When the memory cell is formed in the p-type well region, the substrate voltage control circuit 8 controls the voltage of the p-type well region in accordance with an operation mode.

For instance, the substrate voltage control circuit 8 sets the p-type well region to OV at the time of read/write, while at the time of erase, sets the p-type well region to the voltage of 15V or more and 40V or less.

A voltage generating circuit 9 generates the voltage applied to a plurality of the word lines in the selected block.

For instance, the voltage generating circuit 9, at the time of read, generates a read voltage and an intermediate voltage. The read voltage is applied to the selected word line in the selected block, and the intermediate voltage is applied to the non-selected word line in the selected block.

In addition, the voltage generating circuit 9, at the time of write, generates a write voltage and an intermediate voltage. The write voltage is applied to the selected word line in the selected block, and the intermediate voltage is applied to the non-selected word line in the selected block.

For instance, a control circuit 10 controls the substrate voltage control circuit 8 and the voltage generating circuit 9.

(2) Device Structure

Figure 5:
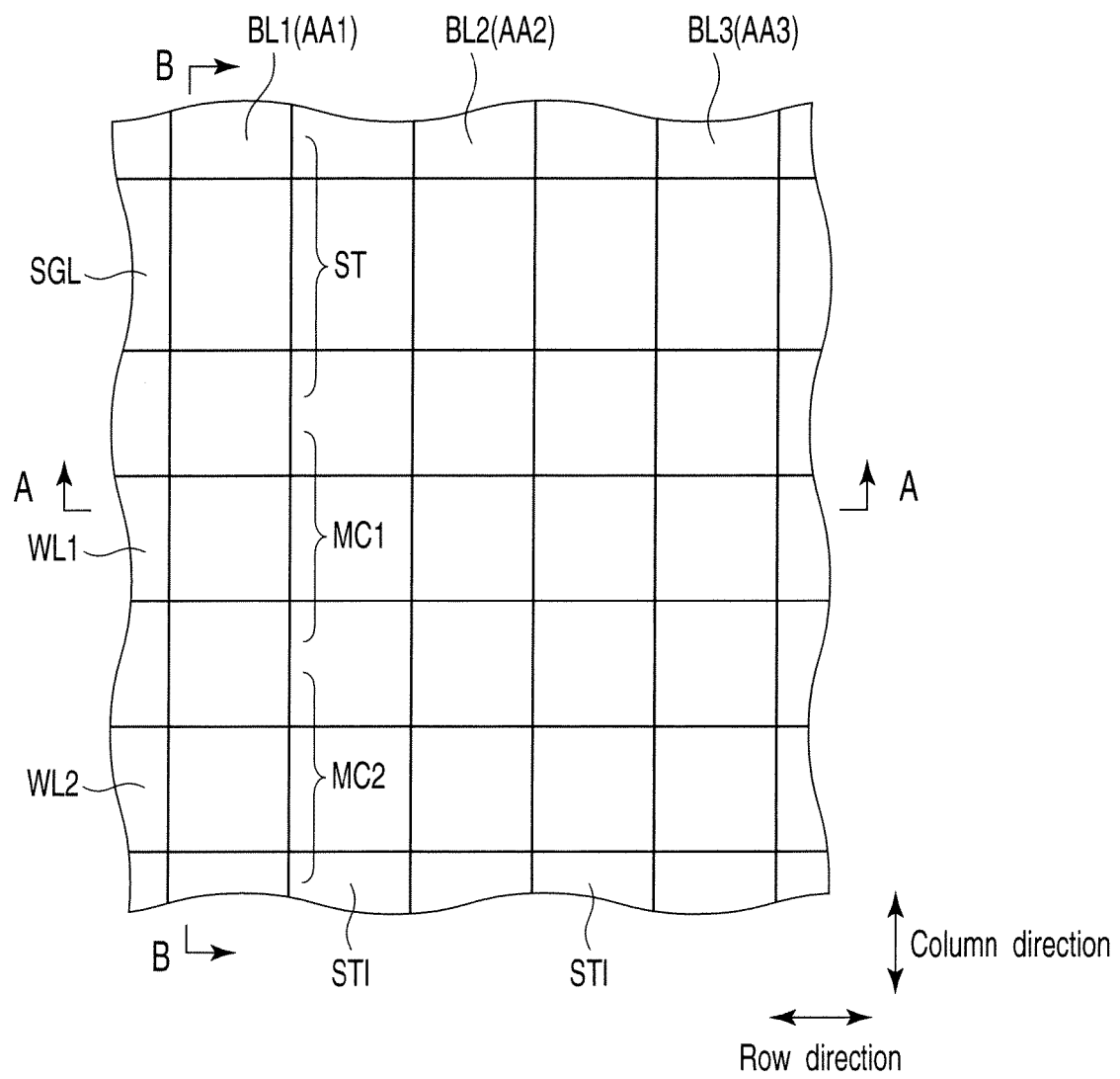
FIG. 5 is a plan view of a cell array.
Figure 6:
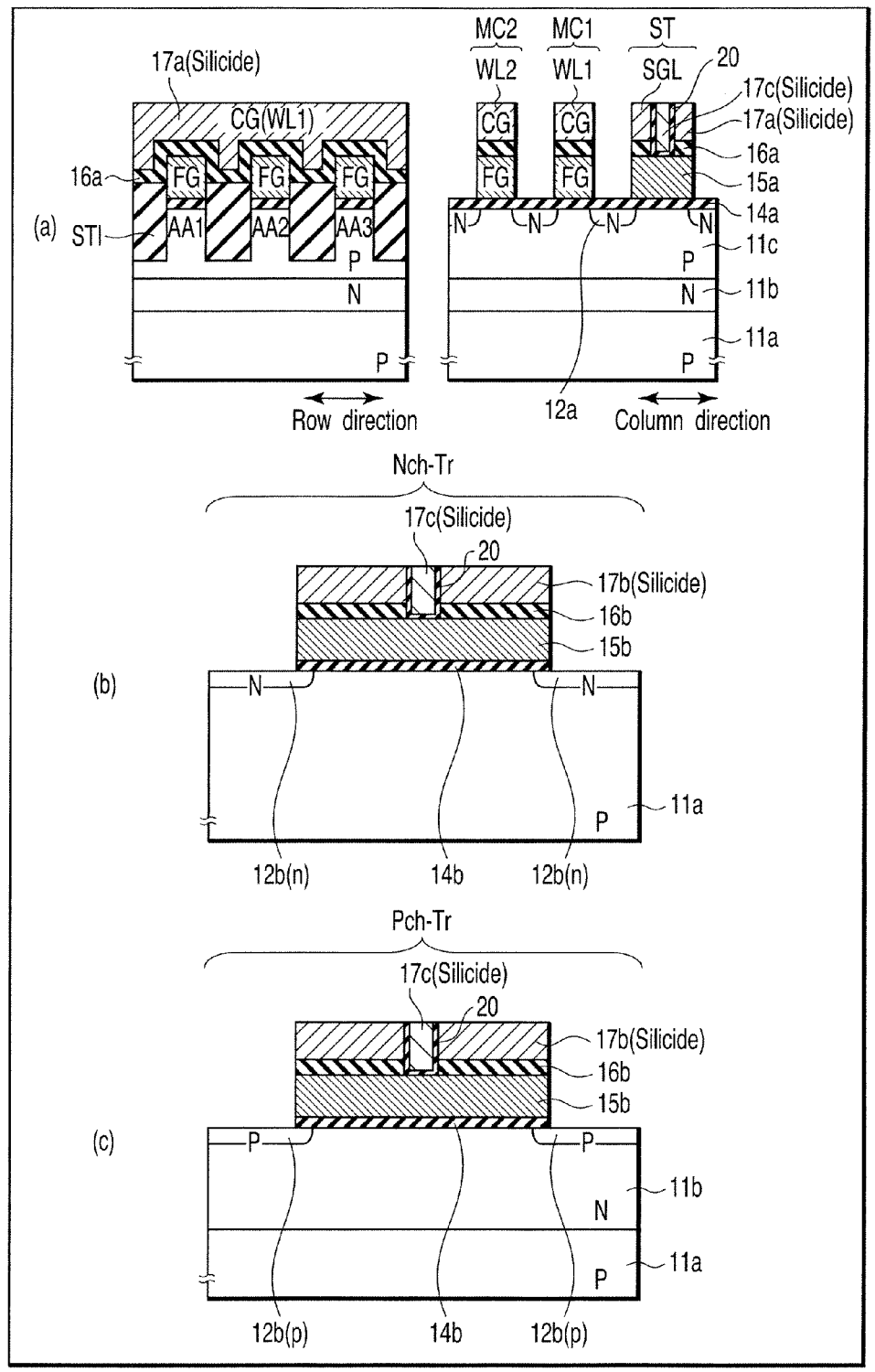
FIG. 6 is a cross sectional view of a device structure according to an application example.

FIG. 5 shows a plan view of the memory cell array. FIG. 6 shows device structures of the memory cell and the peripheral transistor.

The cross sectional view in the row direction of left hand side of FIG. 6(a) corresponds to the cross sectional view along A-A line of FIG. 5, and the cross sectional view in the column direction of right hand side corresponds to the cross sectional view along B-B line of FIG. 5. However, the bit line is omitted.

FIGS. 6(b) and 6(c) are the cross sectional views of the FET constituting the peripheral transistors, for instance, the word line driver, a sense amplifier and the like.

In the P-type silicon substrate 11a, an element isolation insulating layer of an STI (Shallow Trench Isolation) structure is formed. The double well region comprised of an N-type well region 11b and a P-type well region 11c is formed under the element isolation insulating layer (STI).

In the element region AA1, a NAND cell unit comprised of a NAND string comprised of a plurality of memory cells MC1, MC2, . . . connected in series, and a selection transistor ST connected to one end of the NAND string is formed.

The memory cells MC1, MC2, . . . have the source/drain diffusion layer 12a in the P-type well region 11c. On the channel region between the source/drain diffusion layers 12a, the floating gate electrode (FG) 15a is formed via the gate insulating film 14a.

On the floating gate electrode 15a, a control gate electrode (WL1, WL2) 17a as the word line is formed via the inter-gate insulating film 16a. The control gate electrode 17a has the FUSI (Full Silicide) structure in which an entirety thereof is silicided.

The selection transistor ST has the source/drain diffusion layer 12a in the P-type well region 11c. On the channel region between the source/drain diffusion layers 12a, the lower gate electrode 15a is formed via the gate insulating film 14a.

On the lower gate electrode 15a, the upper gate electrode (SGL) 17a as a selection gate line is formed via the inter-gate insulating film 16a.

The inter-gate insulating film 16a of the selection transistor ST has an opening. The opening is covered by the block film 20 having a function to block diffusion of the metal atoms. On the block film 20, the conductive film 17c is formed.

The lower gate electrode 15a, the upper gate electrode 17a and the conductive film 17c are electrically connected mutually via the block film 20.

Although the upper gate electrode 17a and the conductive film 17c have the FUSI (Full Silicide) structure in which an entirety thereof is silicided, the lower gate electrode 15a is not silicided.

Since the peripheral circuit is comprised of the CMOS circuit, two kinds of an N-channel FET and a P-channel FET exist as the peripheral transistor (FET) Tr. In addition, in the peripheral transistor Tr, current driving force or thickness of the gate insulating film is controlled in accordance with driving voltage.

The N-channel FET has an N-type source/drain diffusion layer 12b (n) in the P-type silicon substrate 11a. On the channel region between the source/drain diffusion layers 12b (n), the lower gate electrode 15b is formed via the gate insulating film 14b.

On the lower gate electrode 15b, the upper gate electrode 17b is formed via the inter-gate insulating film 16b.

The P-channel FET has a P-type source/drain diffusion layer 12b (p) in the N-type well region 11b. On the channel region between the source/drain diffusion layers 12b (p), the lower gate electrode 15b is formed via the gate insulating film 14b.

On the lower gate electrode 15b, the upper gate electrode 17b is formed via the inter-gate insulating film 16b.

The inter-gate insulating films 16a of N-channel FET and P-channel FET concurrently have the openings. The opening is covered by the block film 20 having a function to block diffusion of the metal atoms. On the block film 20, the conductive film 17c is formed.

The lower gate electrode 15b, the upper gate electrode 17b and the conductive film 17c are electrically connected mutually via the block film 20.

The upper gate electrode 17b and the conductive film 17c have the FUSI (Full Silicide) structure in which an entirety thereof is silicided, while the lower gate electrode 15b is not silicided.

(3) Manufacturing Method (First Example)

There will be described about a first example of a method of manufacturing the device structure of FIGS. 5 and 6.

Figure 7:
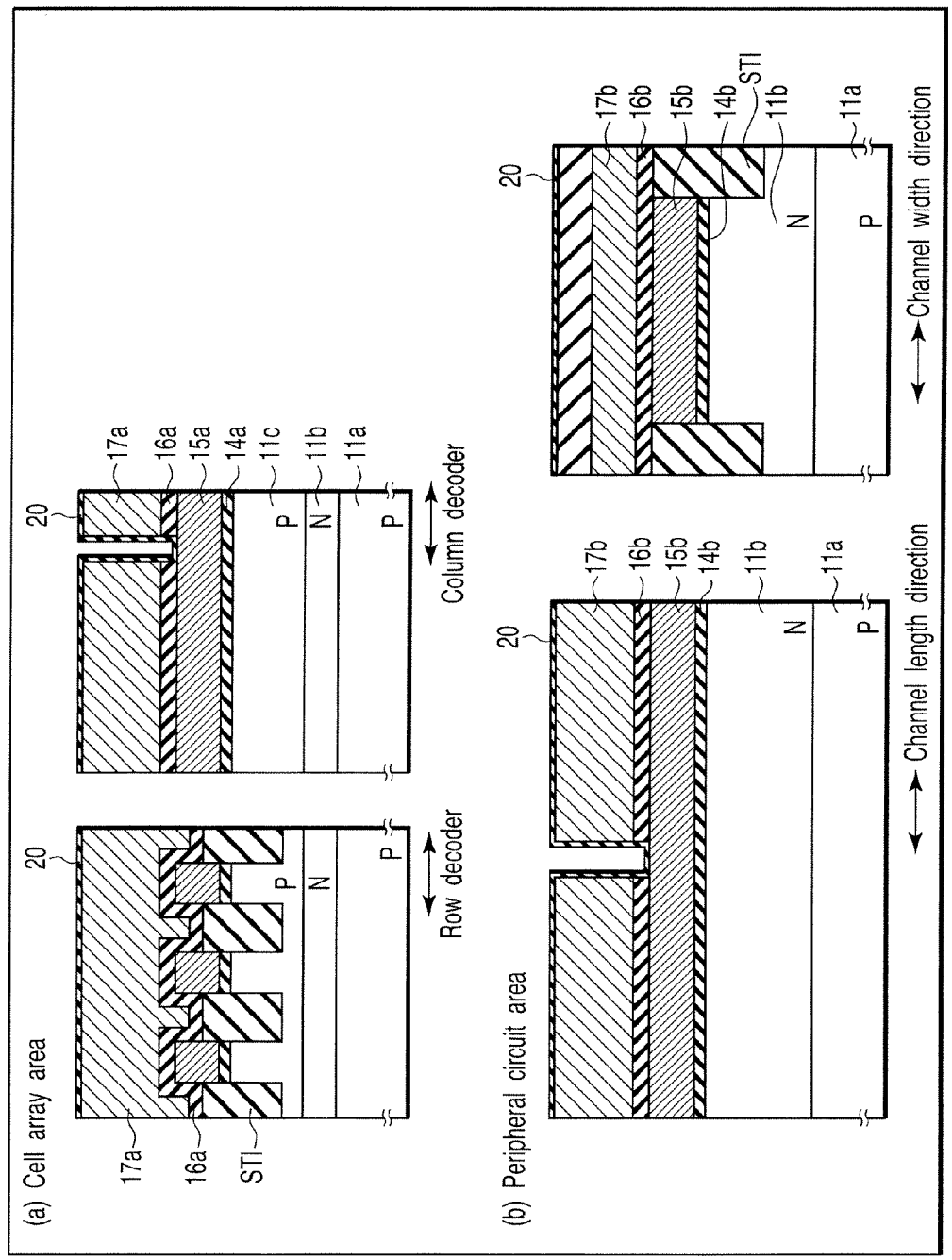
FIG. 7 is a cross sectional view showing a first example of a manufacturing method.

As shown in FIG. 7, in the P-type silicon substrate 11a, the double well region comprised of the N-type well region 11b and the P-type well region 11c is formed.

In addition, gate insulating films ($SiO_2$) 14a and 14b are formed on the silicon substrate (including well region) 11a by the thermal oxidation method. Subsequently, first conductive films (conductive polysilicon) 15a and 15b are formed on the gate insulating films 14a and 14b by the CVD method.

A slit (opening) extending in the column direction is formed on the silicon substrate (including well region) 11a and the first conductive films 15a and 15b.

In addition, after forming an insulating film (for instance, $SiO_2$) completely filling the slit by using the CVD method, the insulating film is etched back. As a result, in a cell array area, upper surfaces of the first conductive films 15a and 15b and part of the side surface thereof are exposed, and further, the element isolation insulating layer with the STI structure is formed in a self-aligning manner.

At this time, in the peripheral circuit area, it is preferable that an upper surface of the element isolation insulating layer with the STI structure is made almost flush with the upper surfaces of the first conductive films 15a and 15b. Because, an etching of the inter-gate insulating films 16a and 16b which is performed after this step becomes easily.

After that, by using the CVD method, the inter-gate insulating films 16a and 16b covering the upper surface of the first conductive films 15a and 15b and part of the side surface thereof are formed. In addition, on the inter-gate insulating films 16a and 16b, second conductive films (conductive polysilicon) 17a and 17b are formed.

Then, by using PEP (Photo Engraving Process) and RIE, at part in which the selection transistor of the cell array area is formed and in the peripheral circuit area, openings reaching the first conductive films 15a and 15b are formed on the respective inter-gate insulating films 16a and 16b and second conductive films 17a and 17b.

In addition, on the second conductive films 17a and 17b and in the opening, the block film 20 is formed. As a method of forming the block film 20, for instance, by using the thermal oxidation method or the CVD method, it is possible to form the film while controlling the film thickness or the film quality. In addition, a natural oxide film formed by exposing the device (wafer) in the air may be used.

In any method, the block film 20 should be controlled in connection with the film thickness or the film quality so as not to possess the insulating function.

Here, for instance, the block film 20 is $SiO_2$ with a film thickness of 2 nm.

Figure 8:
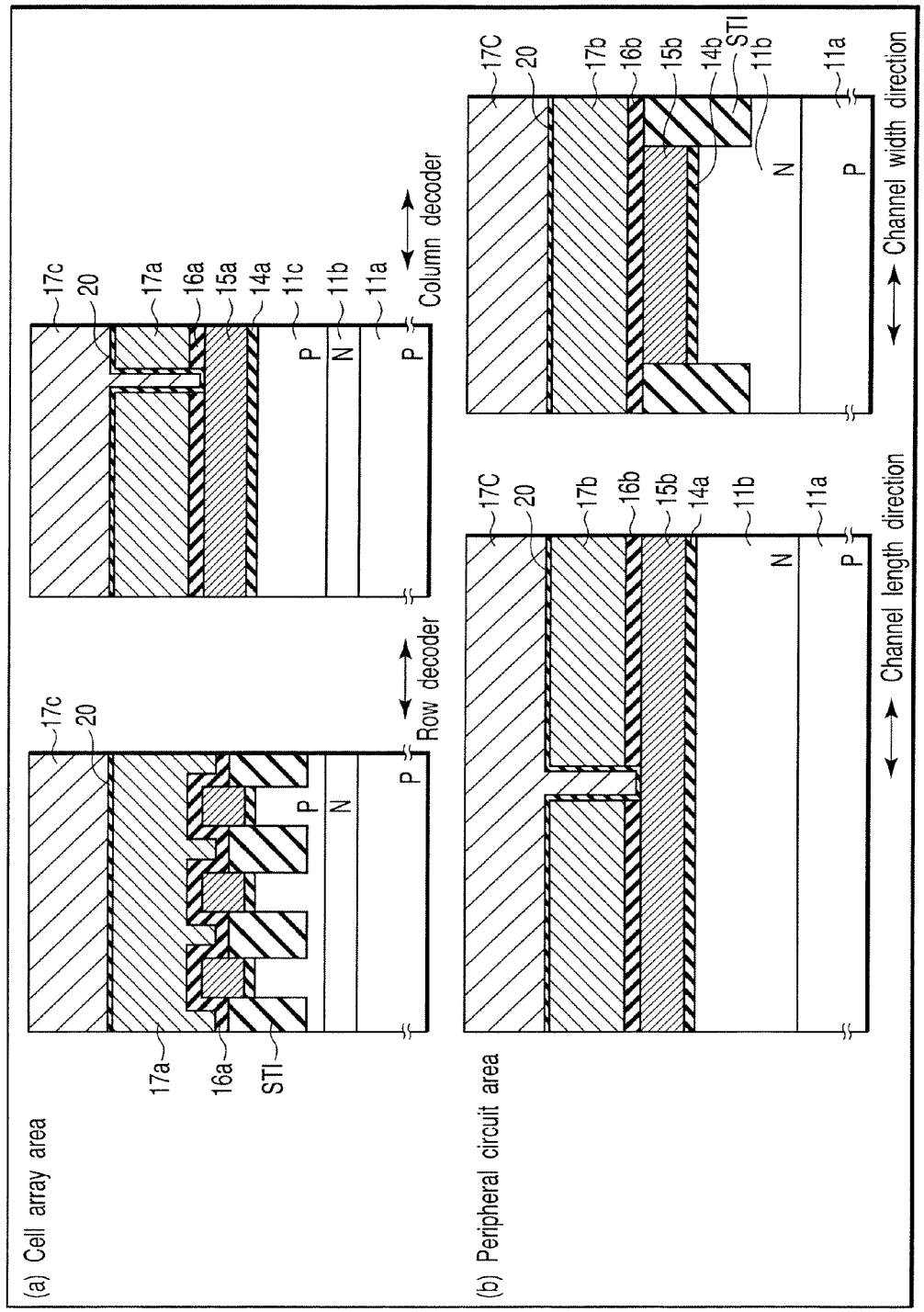
FIG. 8 is a cross sectional view showing the first example of the manufacturing method.

As shown in FIG. 8, by using the CVD method, a third conductive film (conductive polysilicon) 17c filling the opening completely is formed on the block film 20.

Figure 9:
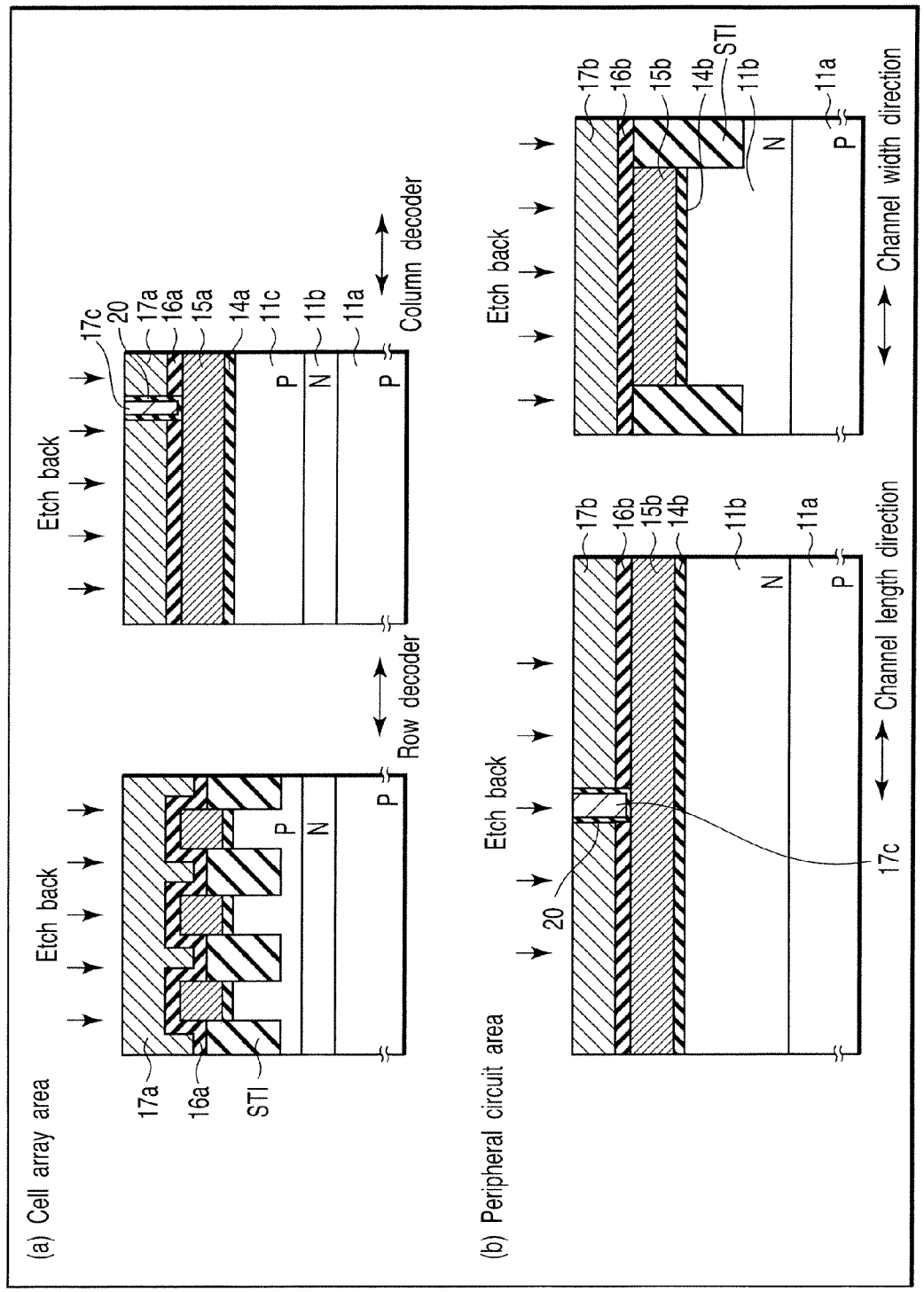
FIG. 9 is a cross sectional view showing the first example of the manufacturing method.

As shown in FIG. 9, the upper surfaces of the second conductive films 17a and 17b are exposed while performing whole surface etch back. At this time, the block film 20 only remains on the opening of the inter-gate insulating films 16a and 16b.

Figure 10:
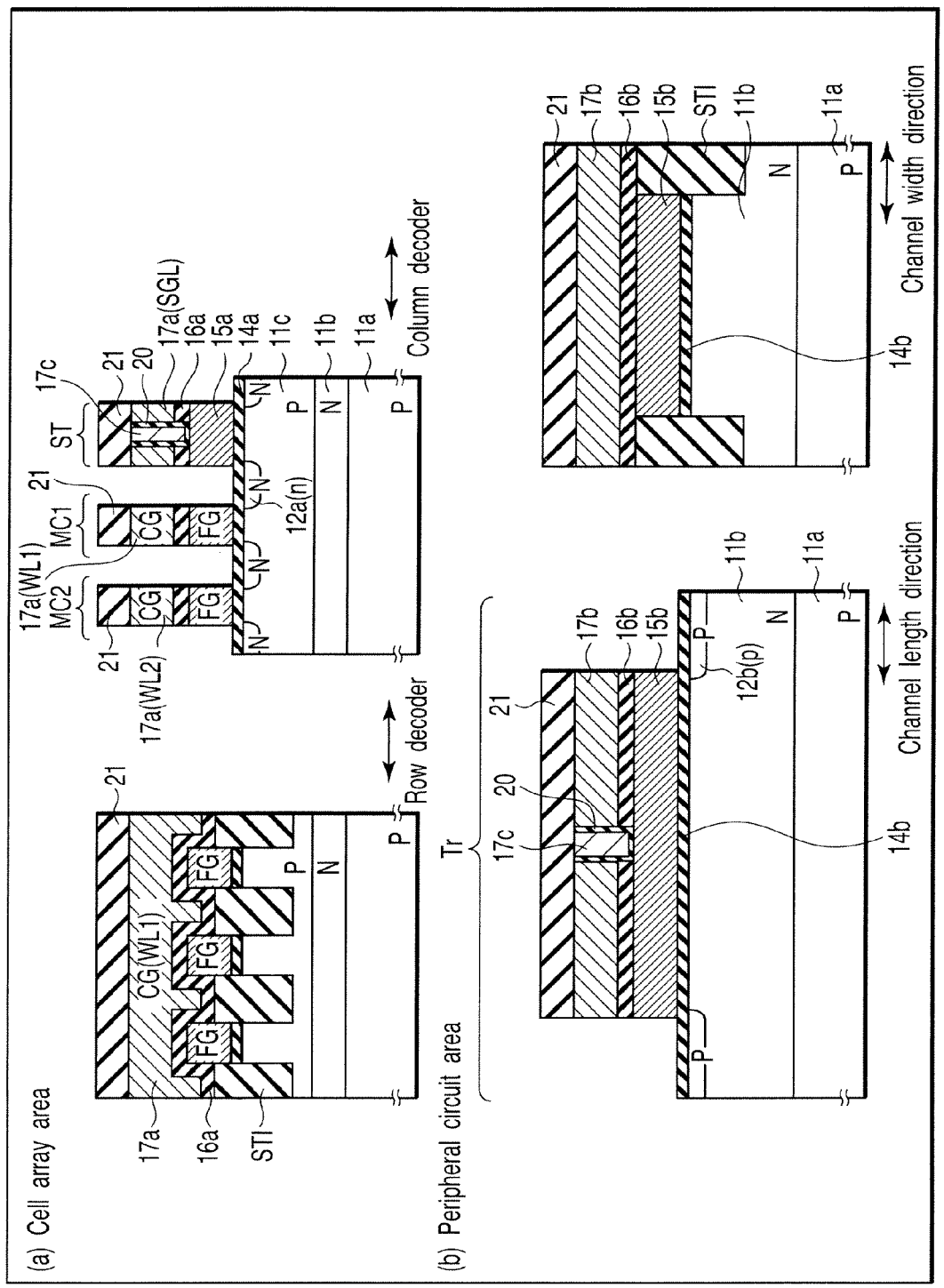
FIG. 10 is a cross sectional view showing the first example of the manufacturing method.

As shown in FIGS. 10 and 11, by using PEP and RIE, an insulating film (for instance, $Si_xN_y$) 21 as a hard mask for gate processing is formed.

Then, by using RIE, with the insulating film 21 as the mask, the second conductive films 17a and 17b, the inter-gate insulating films 16a and 16b and the first conductive films 15a and 15b are etched sequentially, so that there are formed memory cells MC1 and MC2 and a gate electrode of the selection transistor ST in the cell array area, and there is formed a gate electrode of the peripheral transistor Tr in the peripheral circuit area.

In addition, in the cell array area, by using the ion implantation method, with the gate electrode as the mask, the N-type source/drain diffusion layer 12a (n) is formed in the P-type well region 11c in a self-aligning manner.

In the peripheral circuit area, by using the ion implantation method, the N-type source/drain diffusion layer 12b (n) is formed in the P-type silicon substrate 11a in a self-aligning manner, and the P-type source/drain diffusion layer 12b (p) is formed in the N-type well region 11b a self-aligning manner.

As shown in FIG. 12, by using the CVD method, an interlayer insulating film (for instance, $SiO_2$) 22 covering the memory cells MC1 and MC2, the selection transistor ST and the peripheral transistor Tr is formed, and further, by using the CMP, the interlayer insulating film 22 is polished, so that an upper surface of the insulating film 21 as the hard mask is exposed.

Figure 13:
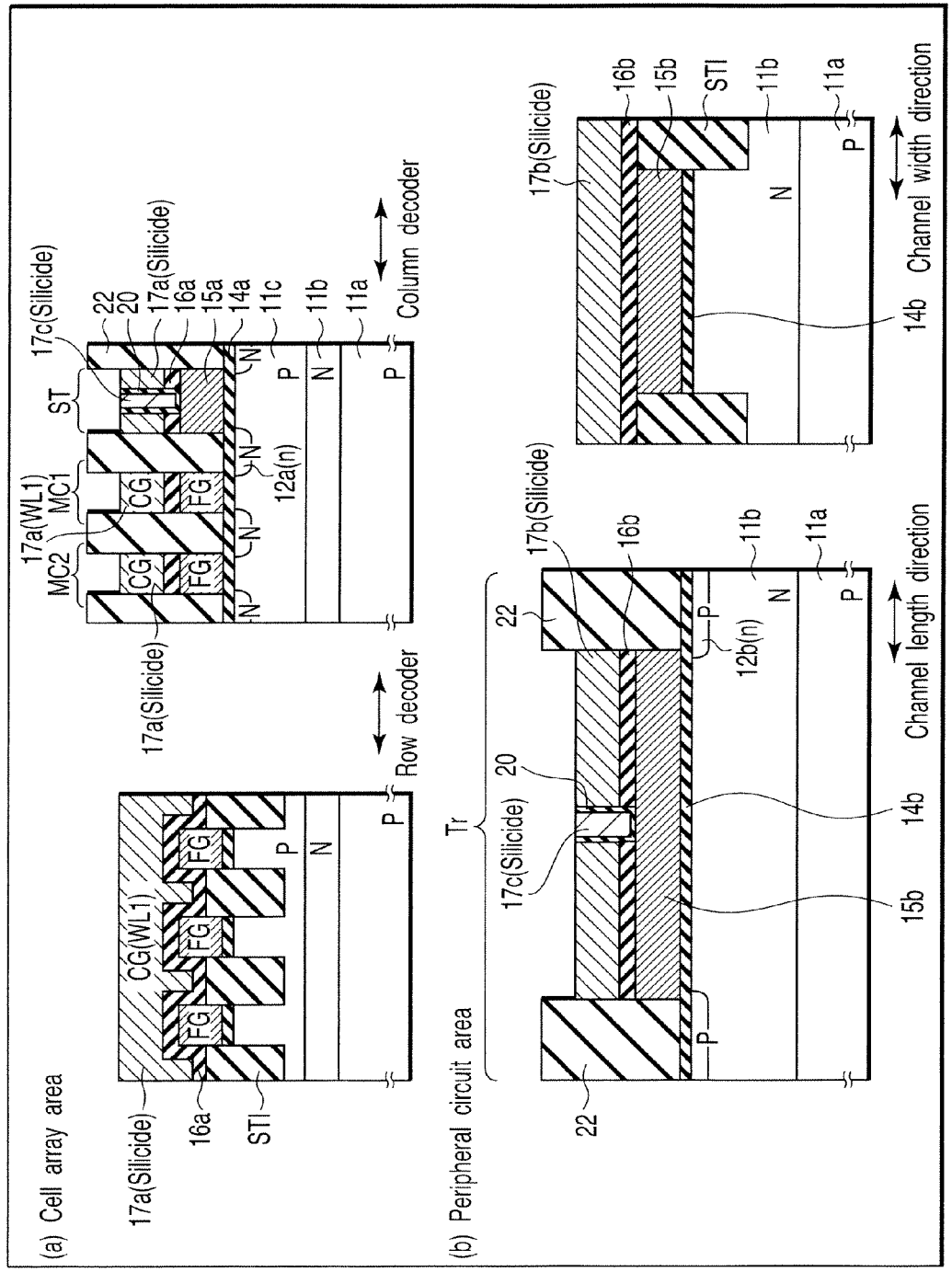
FIG. 13 is a cross sectional view showing the first example of the manufacturing method.

When removing the insulating film 21 selectively, as shown in FIG. 13, the upper surfaces of the second conductive films 17a and 17b and the upper surface of the third conductive film 17c are exposed.

As shown in FIG. 13, an entirety of the second conductive films 17a and 17b and an entirety of the third conductive film 17c are fully silicided.

There is no limitation with respect to a method of silicide formation. For instance, it is possible to obtain the FUSI (Full-Silicide) structure easily in such a way that a refractory metal film is formed on the second conductive films 17a and 17b and the third conductive film 17c, after which thermal treatment is performed, and then the refractory metal and the conductive polysilicon are reacted.

However, at this time, due to existence of the block film 20, the first conductive films 15a and 15b are prevented from being silicided.

By going through the formation process of the conductive lines such as source lines and bit lines, the NAND type flash memory is completed.

According to such manufacturing method, even though the second conductive films 17a and 17b and the third conductive film 17c are fully silicided, since the lower gate electrode 15a of the selection transistor ST and the lower gate electrode 15b of the peripheral transistor Tr are not silicided, fluctuation in threshold voltage of the selection transistor ST and the peripheral transistor Tr is not generated.

(4) Manufacturing Method (Second Example)

There will be described about a second example of the method of manufacturing the device structure of FIGS. 5 and 6.

Figure 15:
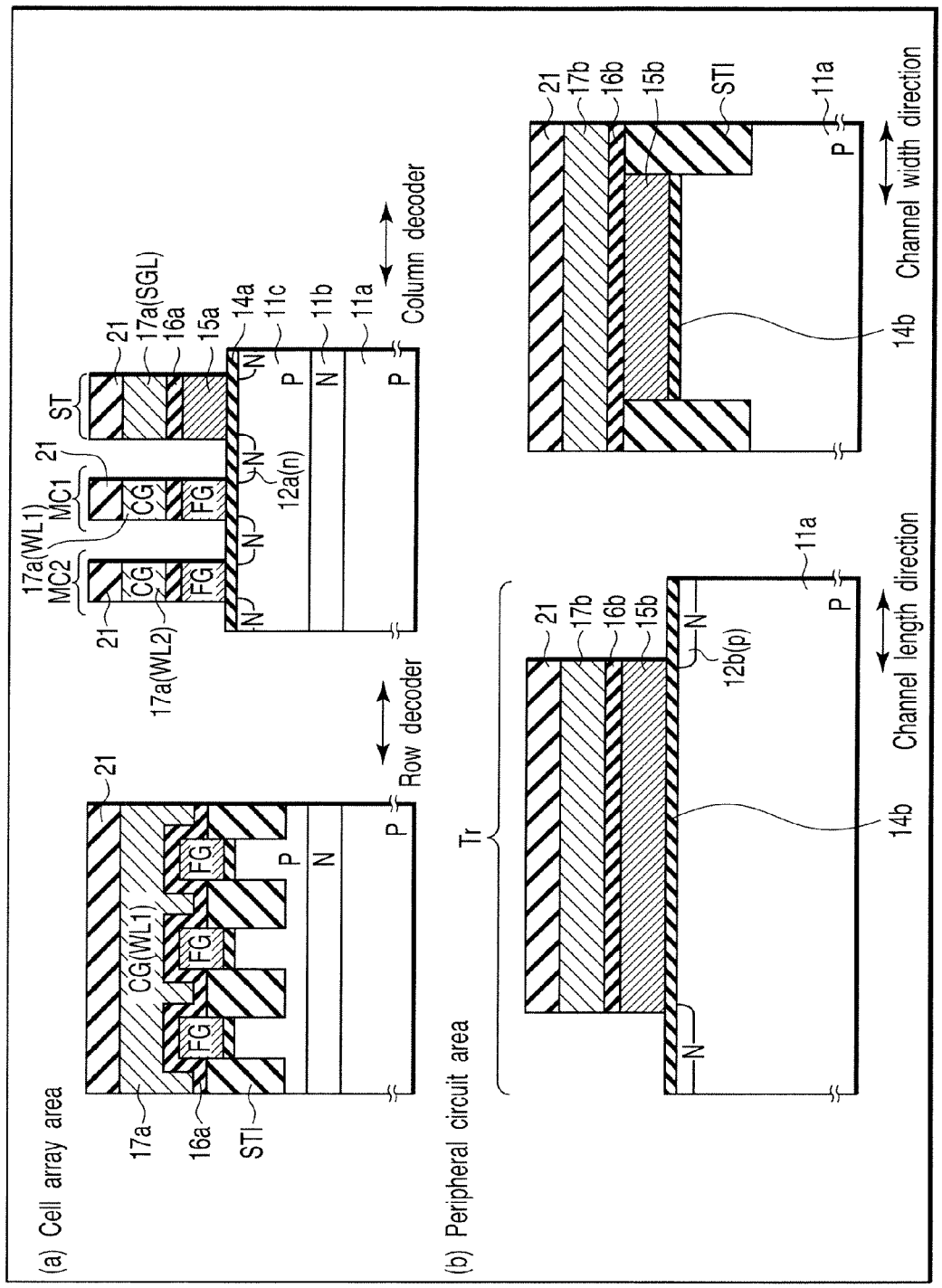
FIG. 15 is a cross sectional view showing the second example of the manufacturing method.

FAs shown in FIGS. 14 and 15, a double well region comprised of the N-type well region 11b and the P-type well region 11c is formed in the P-type silicon substrate 11a.

In addition, by using the thermal oxidation method, gate insulating films (for instance, $SiO_2$) 14a and 14b are formed on the silicon substrate (including well region) 11a. Subsequently, by using the CVD method, first conductive films (conductive polysilicon) 15a and 15b are formed on the gate insulating films 14a and 14b.

A slit (opening) extending in the column direction is formed on the silicon substrate (including well region) 11a and the first conductive films 15a and 15b.

In addition, after forming an insulating film (for instance, $SiO_2$) completely filling the slit by using the CVD method, the insulating film is etched back. As a result, in a cell array area, upper surfaces of the first conductive films 15a and 15b and part of the side surface thereof are exposed, and further, an element isolation insulating layer with the STI structure is formed in a self-aligning manner.

At this time, in the peripheral circuit area, it is preferable that an upper surface of the element isolation insulating layer with the STI structure is made almost flush with the upper surfaces of the first conductive films 15a and 15b.

By using the CVD method, inter-gate insulating films 16a and 16b covering the upper surfaces of the first conductive films 15a and 15b and part of the side surface thereof are formed. In addition, on the inter-gate insulating films 16a and 16b, second conductive films (conductive polysilicon) 17a and 17b are formed.

In addition, by using PEP and RIE, an insulating film (for instance, $Si_xN_y$) 21 as a hard mask for gate processing is formed.

By using RIE, with the insulating film 21 as the mask, the second conductive films 17a and 17b, the inter-gate insulating films 16a and 16b and the first conductive films 15a and 15b are etched sequentially, so that there are formed memory cells MC1 and MC2 and a gate electrode of the selection transistor ST in the cell array area, and there is formed a gate electrode of the peripheral transistor Tr in the peripheral circuit area.

In the cell array area, by using the ion implantation method, with the gate electrode as the mask, the N-type source/drain diffusion layer 12a (n) is formed in the P-type well region 11c in a self-aligning manner.

In the peripheral circuit area, by using the ion implantation method, the N-type source/drain diffusion layer 12b (n) is formed in the P-type silicon substrate 11a in a self-aligning manner, and the P-type source/drain diffusion layer 12b (p) is formed in the N-type well region lib in a self-aligning manner.

Figure 16:
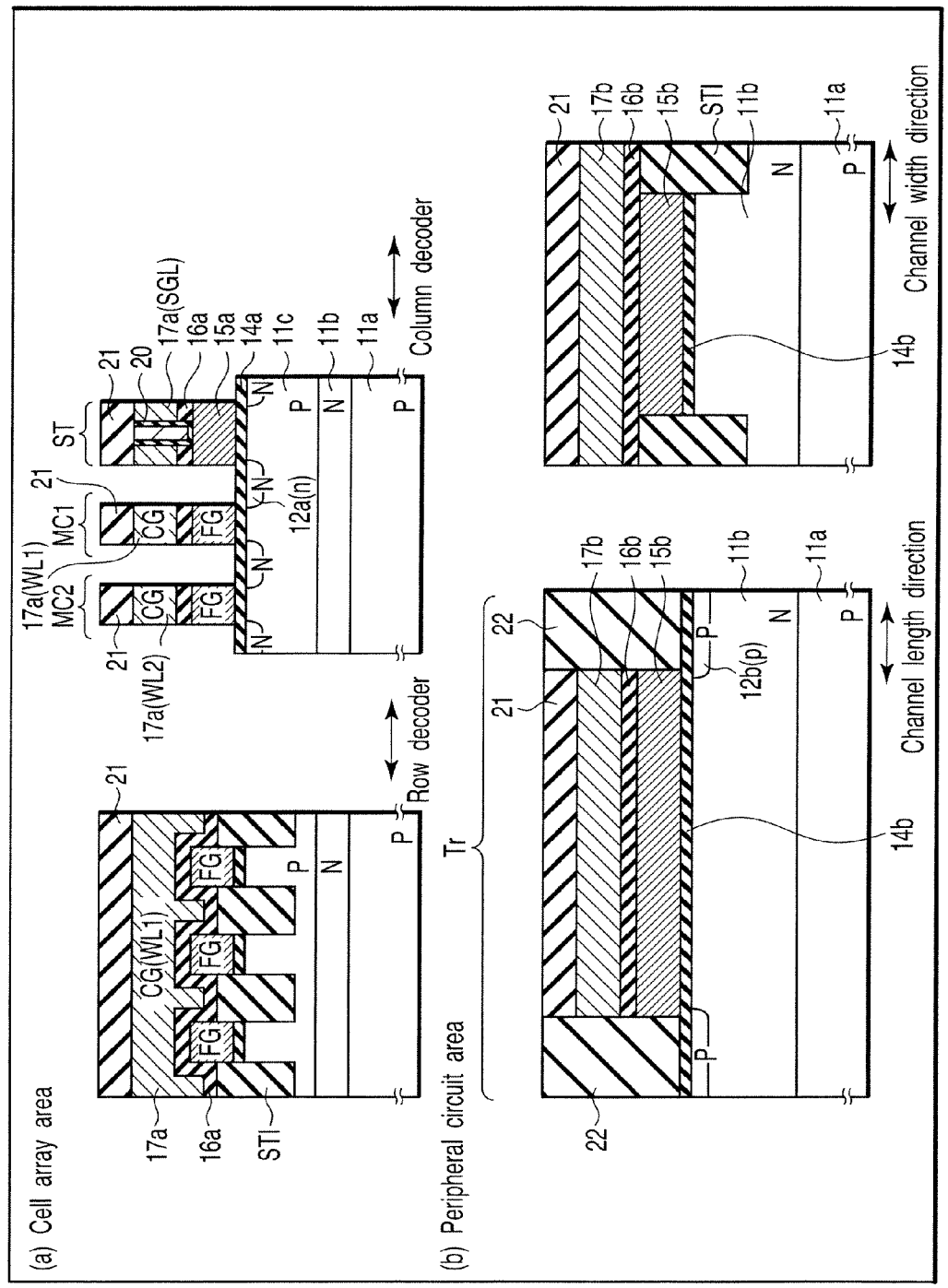
FIG. 16 is a cross sectional view showing the second example of the manufacturing method.

As shown in FIG. 16, by using the CVD method, an interlayer insulating film (for instance, $SiO_2$) 22 covering the memory cells MC1 and MC2, the selection transistor ST and the peripheral transistor Tr is formed, and further, by using the CMP, the interlayer insulating film 22 is polished, so that an upper surface of the insulating film 21 as the hard mask is exposed.

Figure 17:
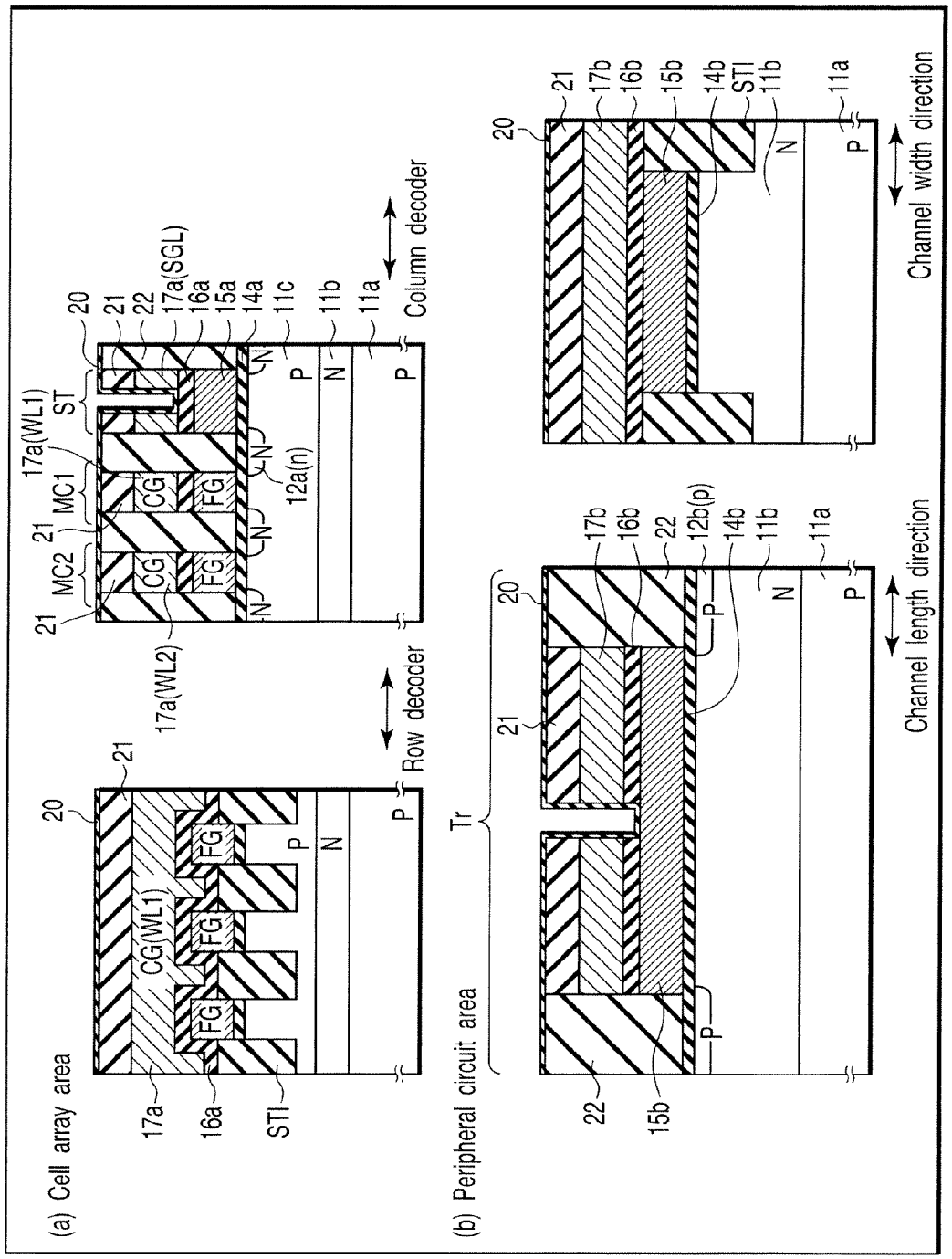
FIG. 17 is a cross sectional view showing the second example of the manufacturing method.

As shown in FIG. 17, by using PEP and RIE, at part in which the selection transistor of the cell array area is formed and in the peripheral circuit area, openings reaching the first conductive films 15a and 15b are formed on the respective inter-gate insulating films 16a and 16b, the second conductive films 17a and 17b and the insulating film 22.

In addition, on the insulating films 21 and 22 and in the opening, the block film 20 is formed. As a method of forming the block film 20, like the first example, for instance, the thermal oxidation method or the CVD method may be used. In addition, a natural oxide film formed by exposing the device (wafer) in the air may be used.

Here, like the first example, for instance, $SiO_2$ with a film thickness of 2 nm is employed as the block film 20 having no insulating function.

As shown in FIG. 18, by using the CVD method, a third conductive film (conductive polysilicon) 17c completely filling the opening is formed on the block film 20.

As shown in FIG. 19, the upper surfaces of the insulating films 21 and 22 are exposed while performing whole surface etch back. At this time, the block film 20 remains only on the opening of the inter-gate insulating films 16a and 16b.

In addition, quantity of the etch back of the third conductive film 17c is controlled so that the upper surface of the third conductive film 17c becomes almost flush with the upper surfaces of the second conductive films 17a and 17b.

Figure 20:
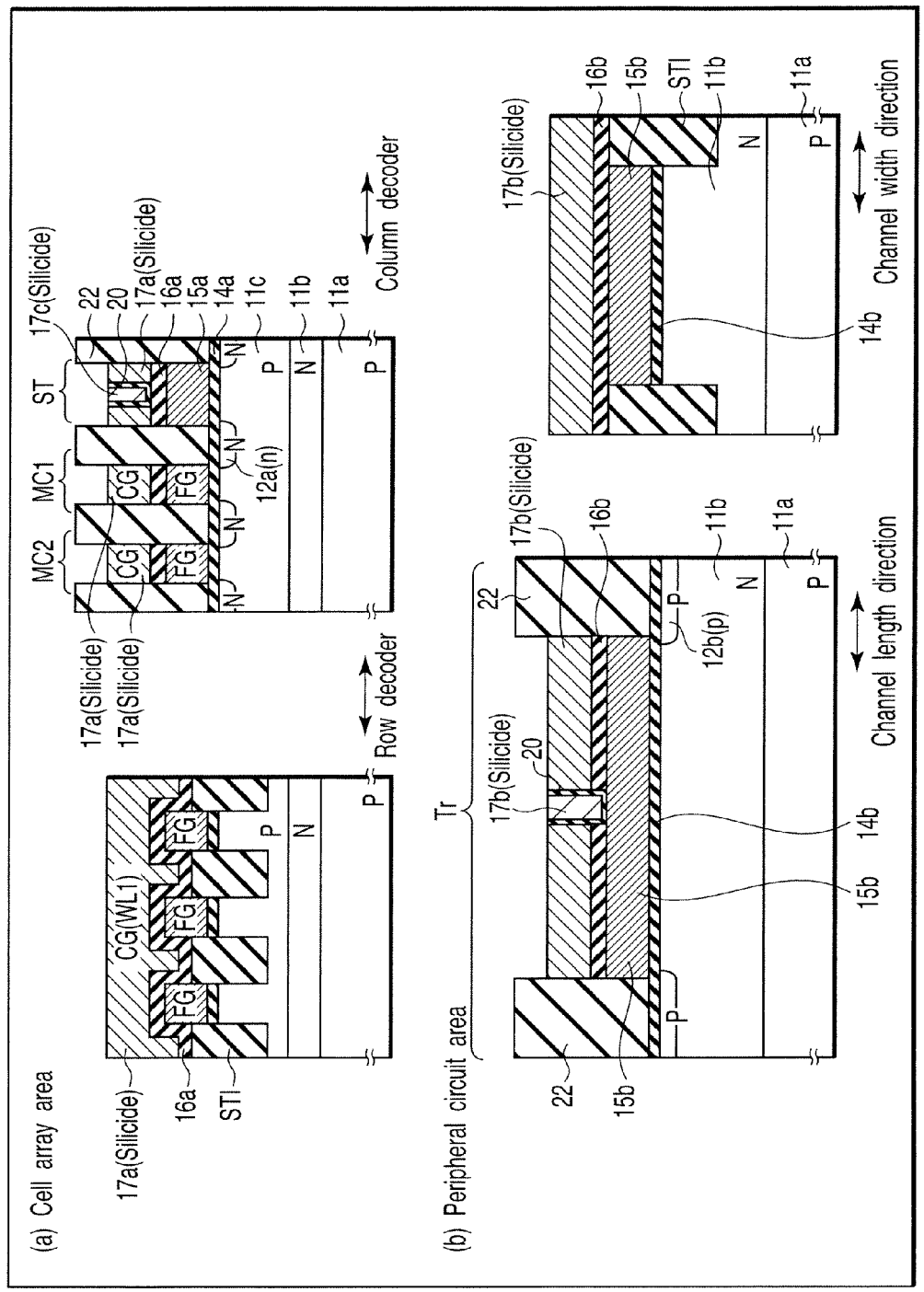
FIG. 20 is a cross sectional view showing the second example of the manufacturing method.

When removing the insulating film 21 selectively, as shown in FIG. 20, the upper surfaces of the second conductive films 17a and 17b and the upper surface of the third conductive film 17c are exposed.

As shown in FIG. 20, an entirety of the second conductive films 17a and 17b and an entirety of the third conductive film 17c are fully silicided.

At this time, due to existence of the block film 20, the silicide formation of the first conductive films 15a and 15b is prevented. By the way, like the first example, there is no limitation with respect to a method of silicide formation.

By going through the formation process of the conductive lines such as source lines and bit lines, the NAND type flash memory is completed.

According to such manufacturing method, like the first example, even though the second conductive films 17a and 17b and the third conductive film 17c are fully silicided, since the lower gate electrode 15a of the selection transistor ST and the lower gate electrode 15b of the peripheral transistor Tr are not silicided, fluctuation in threshold voltage of the selection transistor ST and the peripheral transistor Tr is not generated.

(5) Others

Since the example of the present invention is for solving the problem occurring when the control gate electrode of the memory cell is fully silicided, the memory cell becomes an essential requirement. However, as the application example, in some cases, it is possible to realize a semiconductor integrated circuit in which only the structure of the peripheral transistor is employed.

4. Ending

According to the example of the present invention, when the control gate electrode is fully silicided, the lower gate electrode of the FET other than the memory cell is not silicided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell having a floating gate electrode, a first inter-gate insulating film arranged on the floating gate electrode, and a control gate electrode arranged on the first inter-gate insulating film; and
an FET having a lower gate electrode, a second inter-gate insulating film with a first film thickness having an opening exposing a top surface of the lower gate electrode and arranged on the lower gate electrode, a block film with a second film thickness different from the first film thickness formed on at least the opening exposing the top surface of the lower gate electrode, and an upper gate electrode contacting to the block film,
wherein the control gate electrode and the upper gate electrode have a full-silicide structure in which an entirety of them is silicided, while the lower gate electrode is not silicided, and
the block film has a concave portion with a concave shape, the upper gate electrode is embedded in the concave portion and the uppermost portion of the block film is higher than an upper surface of the second inter-gate insulating film.

2. The nonvolatile semiconductor memory according to claim 1,
wherein the block film is a natural oxide film.

3. The nonvolatile semiconductor memory according to claim 1,
wherein the FET is a selection transistor in a cell array area.

4. The nonvolatile semiconductor memory according to claim 1,
wherein the FET is a peripheral transistor in a peripheral circuit area.

5. The nonvolatile semiconductor memory according to claim 1,
wherein the floating gate electrode and the lower gate electrode are comprised of conductive polysilicon.

6. The nonvolatile semiconductor memory according to claim 1, further comprising a silicide layer formed on the lower gate electrode and contacting to a side surface of the block film.

7. The nonvolatile semiconductor memory according to claim 1, wherein the block film is an oxide film.

8. The nonvolatile semiconductor memory according to claim 1,
wherein the uppermost portion of the block film is equal to an upper surface of the control gate electrode.

* * * * *